US008203324B2

(12) United States Patent
Werking

(10) Patent No.: US 8,203,324 B2

(45) Date of Patent: Jun. 19, 2012

(54) LOW VOLTAGE BANDGAP VOLTAGE REFERENCE CIRCUIT

(75) Inventor: Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 346 days.

(21) Appl. No.: 12/559,707

(22) Filed: Sep. 15, 2009

(65) Prior Publication Data

US 2011/0062937 A1 Mar. 17, 2011

(51) Int. Cl.
*G05F 3/16* (2006.01)

(52) U.S. Cl. ......................... 323/313; 323/907; 327/357

(58) Field of Classification Search .......... 323/312–316, 323/906, 907; 327/332, 355, 356, 357, 538, 327/563; 330/253, 255, 257, 277
See application file for complete search history.

(56) References Cited

U.S. PATENT DOCUMENTS 5,471,169 A * 11/1995 Dendinger .................... 327/563
5,576,941 A * 11/1996 Nguyen et al. ............. 363/21.07
6,529,066 B1 * 3/2003 Guenot et al. ................ 327/539
7,122,997 B1 * 10/2006 Werking ....................... 323/313
7,643,629 B2 * 1/2010 Hein et al. ............... 379/399.01

* cited by examiner

*Primary Examiner* — Rajnikant Patel
(74) *Attorney, Agent, or Firm* — Shumaker & Sieffert, P.A.

(57) ABSTRACT

A temperature compensated low voltage reference circuit can be realized with a reduced operating voltage overhead and reduced spatial requirements This is accomplished in several ways including integrating one or more bipolar junction transistors into a current differencing amplifier and reducing the number of components required to implement various voltage reference circuits. All of the reference circuits may be constructed with various types of transistors including DTMOS transistors.

20 Claims, 9 Drawing Sheets

LOW VOLTAGE BANDGAP VOLTAGE REFERENCE CIRCUIT

BACKGROUND

1. Field of Invention

The present invention relates to semiconductor integrated circuits, and more specifically, to a low voltage reference circuit that is capable of outputting a plurality of voltages with minimal operating voltage overhead.

2. Description of Related Art

In many devices that incorporate analog, digital, and/or mixed-signal integrated circuits, voltage reference circuits are of critical importance to the proper functioning of the device. For example, circuits such as oscillators, Phase Locked Loops (PLLs), Digital-to-Analog Converters (DACs), and Analog-to-Digital Converters (ADCs), depend on stable, temperature-independent voltage references. As the critical dimensions of integrated circuits have decreased over time, the operating voltages of these integrated circuits have also decreased. With the decrease in operating voltages of integrated circuits, the need for temperature-independent voltage reference circuits with low operating voltages has increased. Many of these voltage reference circuits provide a stable reference voltage output while operating at voltages at or below 1.3V.

One of the ways to reduce the costs associated with the manufacture of integrated circuits involves limiting the area used to implement circuits within the integrated circuit. In general, circuits that are less complex and require less area to implement are less expensive to manufacture. Further, by reducing the area required to implement some of the circuits within an integrated circuit, it may be possible to reduce the overall size of the integrated circuit, permitting the integrated circuit to be incorporated into smaller devices.

SUMMARY

Disclosed herein are voltage reference circuits that provide temperature compensated voltage outputs with a reduced operational input voltage overhead and may be implemented over a smaller surface area than conventional voltage reference circuits.

In example embodiments, a current differencing amplifier is incorporated into a voltage reference circuit, wherein Bipolar Junction Transistors (BJTs) that are traditionally constructed as components outside of the current differencing amplifier are incorporated into the current differencing amplifier. In some example implementations, two current mirrors within the current differencing amplifier are modified to include floating BJTs. In such example implementations, the incorporation of BJTs into the current differencing amplifier reduces the space required to implement the particular voltage reference circuit by eliminating the need to construct two BJTs in another portion of the circuit.

In example implementations of some of the embodiments disclosed herein, a current differencing amplifier with BJTs is incorporated into a voltage reference circuit that is configured to operate at a supply voltage less than the bandgap voltage of the semiconducting material used to construct the voltage reference circuit.

These as well as other aspects and advantages of the present invention will become apparent to those of ordinary skill in the art by reading the following detailed description, with appropriate reference to the accompanying drawings.

BRIEF DESCRIPTION OF THE DRAWINGS

Preferred embodiments of the present invention are described with reference to the following drawings, wherein.

DETAILED DESCRIPTION

In view of the wide variety of embodiments to which the principles of the present invention can be applied, it should be understood that the illustrated embodiments are examples only, and should not be taken as limiting the scope of the present invention.

Several embodiments of a temperature compensated voltage reference circuit are presented herein. In the embodiments described herein, a current differencing amplifier is incorporated into the voltage reference circuit. In such embodiments, the current differencing amplifier has been constructed such that one or more Bipolar Junction Transistors (BJTs) are integrated into the current differencing amplifier, eliminating the need to construct the integrated BJTs elsewhere in the voltage reference circuits. In some of these embodiments, the area required to implement one of the disclosed voltage reference circuits is smaller than the area required to implement a comparable prior art voltage reference circuit.

Figure 1:
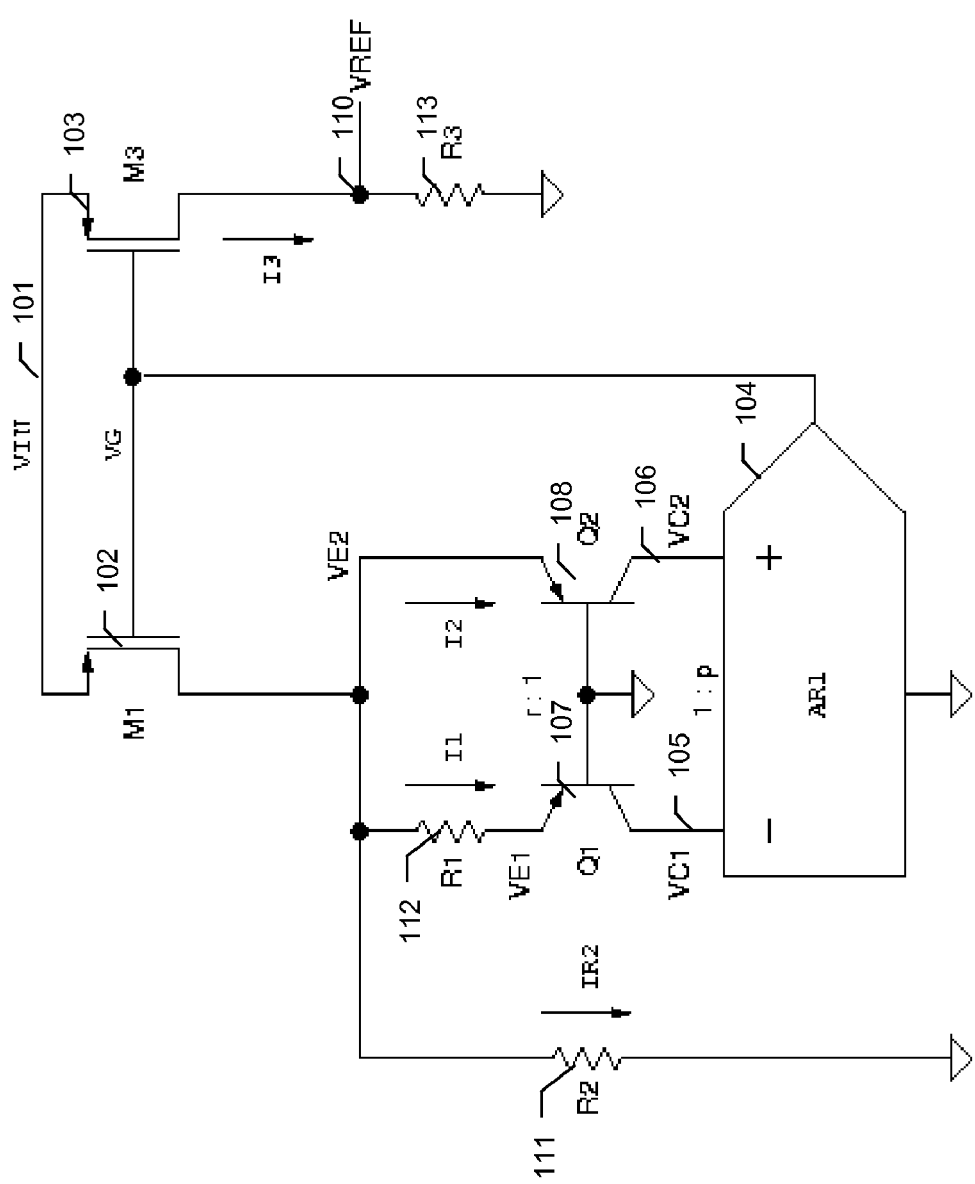
FIG. 1 is a schematic drawing of a prior art voltage reference circuit.

Turning now to the figures, FIG. 1 is a schematic drawing of a prior art temperature compensated voltage reference circuit 100 similar to a circuit described in U.S. Pat. No. 7,122,997 which is hereby incorporated by reference. The operating voltage for the circuit 100 is marked as $V_{IN}$ 101 and it is applied at the node of the connected sources of transistors $M_1$ 102, and $M_3$ 103. As shown in FIG. 1, the circuit 100 employs a feedback network comprised of a current-differencing amplifier AR1 104. AR1 104 translates a difference in currents into an output voltage. Those skilled in the art will appreciate that a current differencing amplifier can be made in various ways and is usually designed such that it does not place constraints on the operating voltage, $V_{IN}$ 101. In circuit 100, terminals $V_{C1}$ 105 and $V_{C2}$ 106 are usually operated at close to 0V. In general, $V_{C1}$ and $V_{C2}$ are usually kept below approximately 0.3V for proper circuit operation at high temperatures.

The emitter current of transistors $Q_1$ 107, which is shown as $I_1$, and $Q_2$ 108, which is shown as $I_2$, have a designed ratio of $p=I_2/I_1$. In some implementations, this ratio is 1:1 but the ratio p can vary depending on the design of the circuit 100. The emitter area of both transistors 107 and 108 is also designed to have a ratio given by $r=A_1/A_2$. As a result, transistors $Q_1$ 107 and $Q_2$ 108 have a fixed current density ratio, $J_2/J_1$, that is equal to the product of p and r.

This circuit produces a reference voltage $V_{REF}$ 110, which is referenced to ground, in accordance with the equation: $V_{REF}=R_3\,[(V_{E2}/R_2)+(p+1)\,(V_T/R_1)\,\ln(p\,r)]$, wherein $V_{E2}$ is the voltage across the base-to-emitter junction of Q2, the ratio $p=I_2/I_1$, the ratio $r=A_1/A_2$, and $V_T=kT/q$.

In the circuit 100, the temperature coefficient of the reference voltage $V_{REF}$ 110 is controlled by the ratio of a resistor $R_2$, marked in FIG. 1 as 111, to another resistor $R_1$, marked in FIG. 1 as 112. The magnitude of the reference voltage $V_{REF}$ 110 is controlled by the value of a resistor $R_3$, marked in FIG. 1 as 113. Circuit 100 in FIG. 1 is capable of operating at a supply voltage, $V_{IN}$ 101 that is less than the bandgap voltage of the semiconducting material used to construct the circuit 101. For example, if the circuit 100 was constructed out of silicon, the circuit 100 would be capable of operating at a supply voltage of less than 1.25V.

Figure 2:
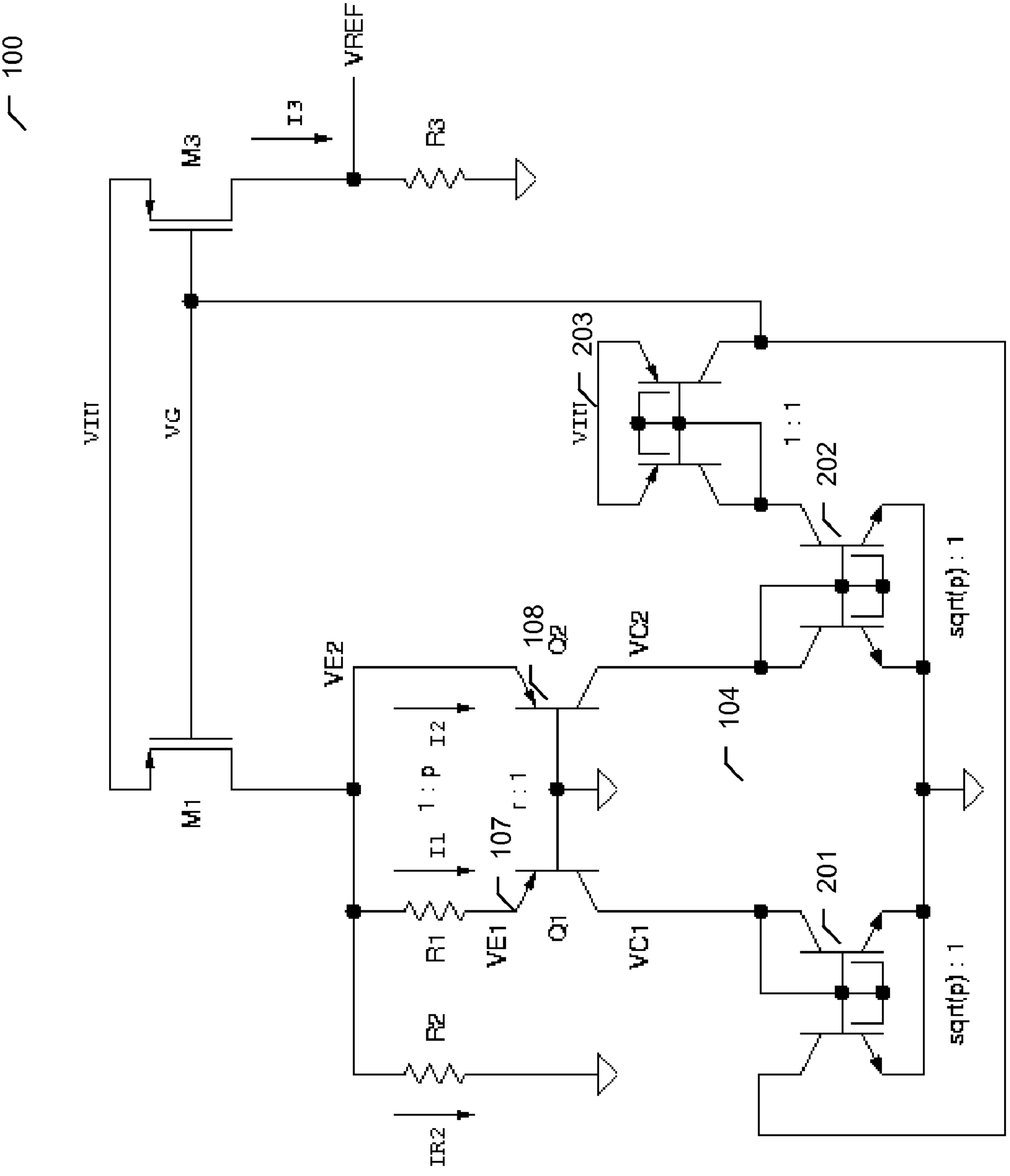
FIG. 2 is a schematic drawing depicting additional details of the prior art voltage reference circuit shown in FIG. 1.

By way of example, FIG. 2 shows additional details of the voltage reference circuit 100 by assuming a particular implementation of current differencing amplifier 104. While there are literally hundreds of ways to implement a current differencing amplifier, the amplifier in FIG. 2, consisting of three current mirrors, is one of the simplest. In FIG. 2, the current differencing amplifier 104 is shown as consisting of three DTMOS current mirrors 201, 202, and 203. These current mirrors use Dynamic Threshold MOS (DTMOS) transistors to ensure that the amplifier 104 is operational at a supply voltage that is less than the $V_{BE}$ voltage of transistors 107 and 108. As such, the amplifier 104 does not limit the potential for low voltage operation of the circuit 100. As shown in FIG. 2, both of the N-type current mirrors 201 and 202 have an area ratio of sqrt(p):1. When constructed in accordance with this ratio, these current mirrors 201 and 202 ensure that the ratio of $I_2/I_1$ is p, wherein $\text{sqrt}(p)^2=p$, when the ratio of the P-type current mirror 203 is 1:1 as also shown in FIG. 2. While not depicted in FIG. 2, it is also possible to generate this same ratio of $I_2/I_1$ by using N-type current mirrors with an area ratio of 1:1 and a P-type current mirror with a ratio of p:1. However, such a configuration may require more area to implement.

Figure 3:
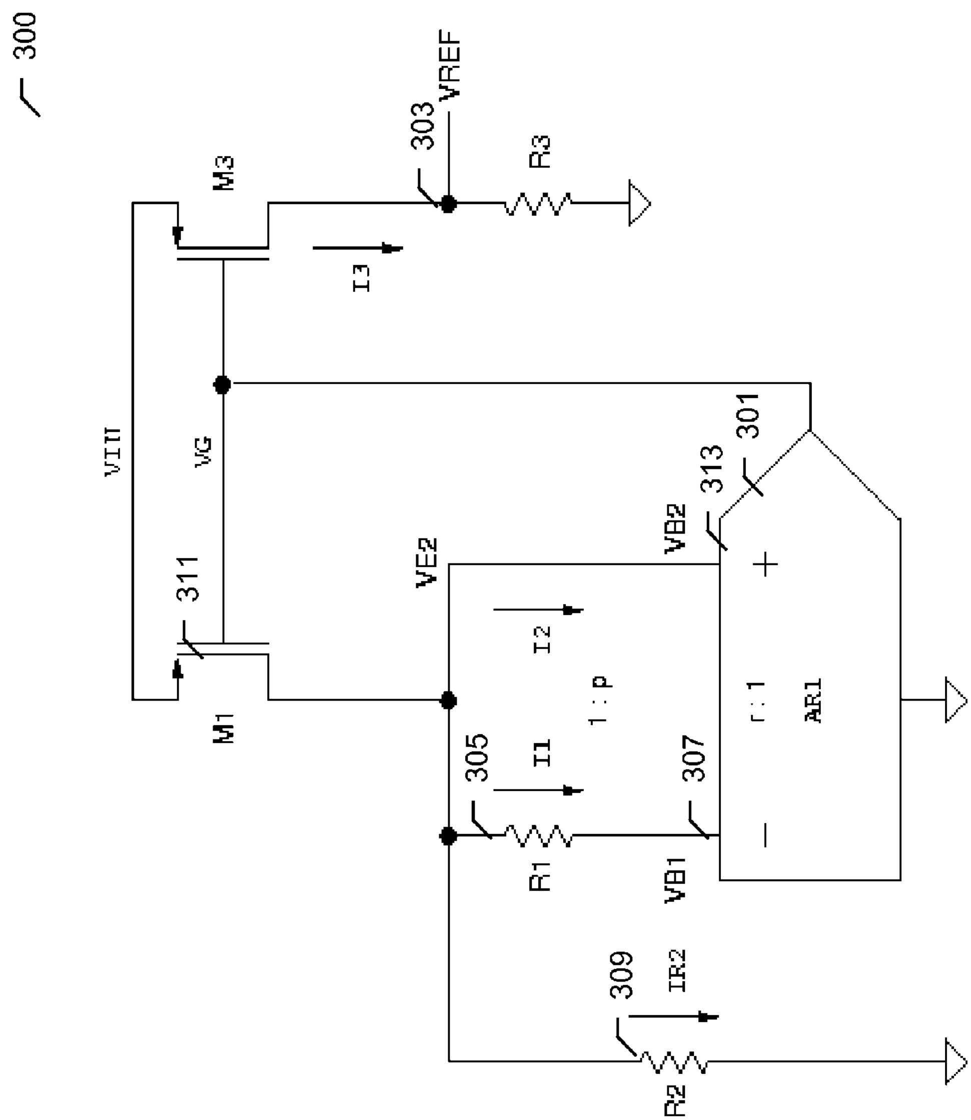
FIG. 3 is a schematic drawing of a voltage reference circuit in accordance with an aspect of the invention.

FIG. 3 is a schematic drawing of an example voltage reference circuit 300 in accordance with one aspect of the invention. As shown in FIG. 3, the circuit 300 is arranged similarly to the circuit 100 depicted in FIG. 1 in that the circuit 300 comprises a current differencing amplifier 301 and produces a reference voltage 303 in accordance with the same equation presented above in reference to circuit 100. However, in the circuit 300, the transistors 107 and 108, which were constructed externally to the current differencing amplifier 104 in circuit 100 have been omitted. In the configuration shown in FIG. 3, one terminal of resistor $R_1$ 305 is electrically connected to input terminal VB1 307 of current differencing amplifier 301. A second terminal of resistor $R_1$ 305 is electrically connected a terminal of resistor $R_2$ 309, the drain of transistor $M_1$ 311, and input terminal VB2 of current differencing amplifier 301. In the configuration shown in FIG. 3, the input transistors of the current differencing amplifier 301 are constructed using bipolar junction transistors rather than MOS transistors or some other input architecture. By using bipolar junction transistors as the input transistors of the current differencing amplifier 301, it is possible to simplify the overall voltage reference circuit.

Figure 4:
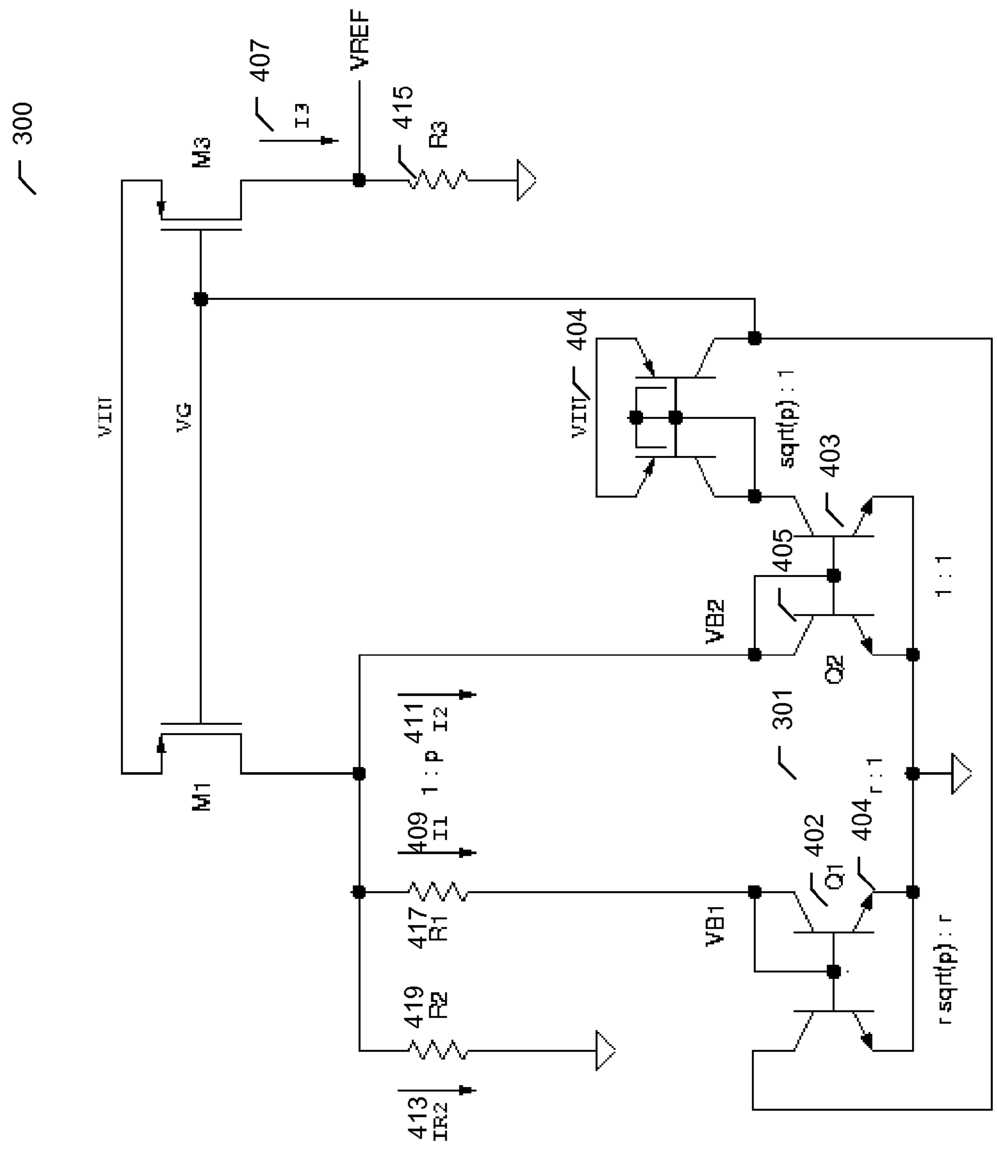
FIG. 4 is a schematic drawing depicting additional details of the voltage reference circuit shown in FIG. 3.

By way of example, FIG. 4 shows additional details of the voltage reference circuit 300 by presenting a particular implementation of the current differencing amplifier 301, shown in FIG. 3. As shown in FIG. 4, one of the current mirrors 402 within the current differencing amplifier 301 has been constructed to incorporate a BJT similar to transistor 107 shown in FIG. 1. Also shown in FIG. 4, a second current mirror 403 within the current differencing amplifier 301 has been constructed to incorporate a BJT similar to BJT 108 shown in FIG. 1. Current mirror 402 is constructed to have an area ratio of r sqrt(p):r, and current mirror 403 is constructed to have an area ratio of 1:1. In this example configuration, the critical transistors, Q1 404 and Q2 405, will have an area ratio of r=A1/A2. Also shown in FIG. 4 is a DTMOS current mirror 404, which is constructed to have an area ratio of sqrt(p):1 in the particular example shown in FIG. 4. In other example embodiments of current differencing amplifier 301, a P-Type current mirror may be constructed to have a current ratio of p:1 and the current mirror 402 may be constructed to have a ratio of r:r. In this implementation of the current differencing amplifier, it is not necessary to use DTMOS transistors in the P-type current mirror if PNP transistors with sufficiently high gain are used. In implementations of the circuit shown in FIG. 4, the input NPN current mirrors could also be implemented with DTMOS transistors to reduce the required operating voltage. However, those of skill in the art will appreciate that the bandgap voltages of DTMOS transistors are more highly dependent on process variables and the inclusion of DTMOS transistors may impact the accuracy of the circuit.

In FIG. 4, the current I3 407 is equal to the sum of three other currents: I1 409, I2 407, and IR2 413.

$$I3=I1+I2+IR2$$

Since I2=p I1, this is equivalent to the following.

$$I3=(1+p)I1+IR2$$

The first term, (1+p) I1, forms a current that is proportional to absolute temperature (PTAT) and the second term, IR2, is proportional to $V_{BE}$ or complementary to absolute temperature (CTAT). When these two currents are summed in the correct proportions, the temperature dependencies cancel and, to a first order, I3 is constant with respect to temperature. By applying this constant current to resistor R3 415, a constant voltage may be developed across R3 415 of any arbitrary value; including values less than the bandgap voltages of transistors Q1 404 and Q2 405. In FIG. 4 this temperature independence (or $V_{REF}$ flatness) may be optimized by adjusting the values of resistors R1 417 and/or R2 419. Due to process variations, it is often necessary to perform this calibration in high precision voltage references after the circuit 300 is fabricated. In some situations, performing a post-fabrication calibration of resistors in the circuit 300 can be difficult to implement in some commercially available semiconductor manufacturing processes.

Figure 5:
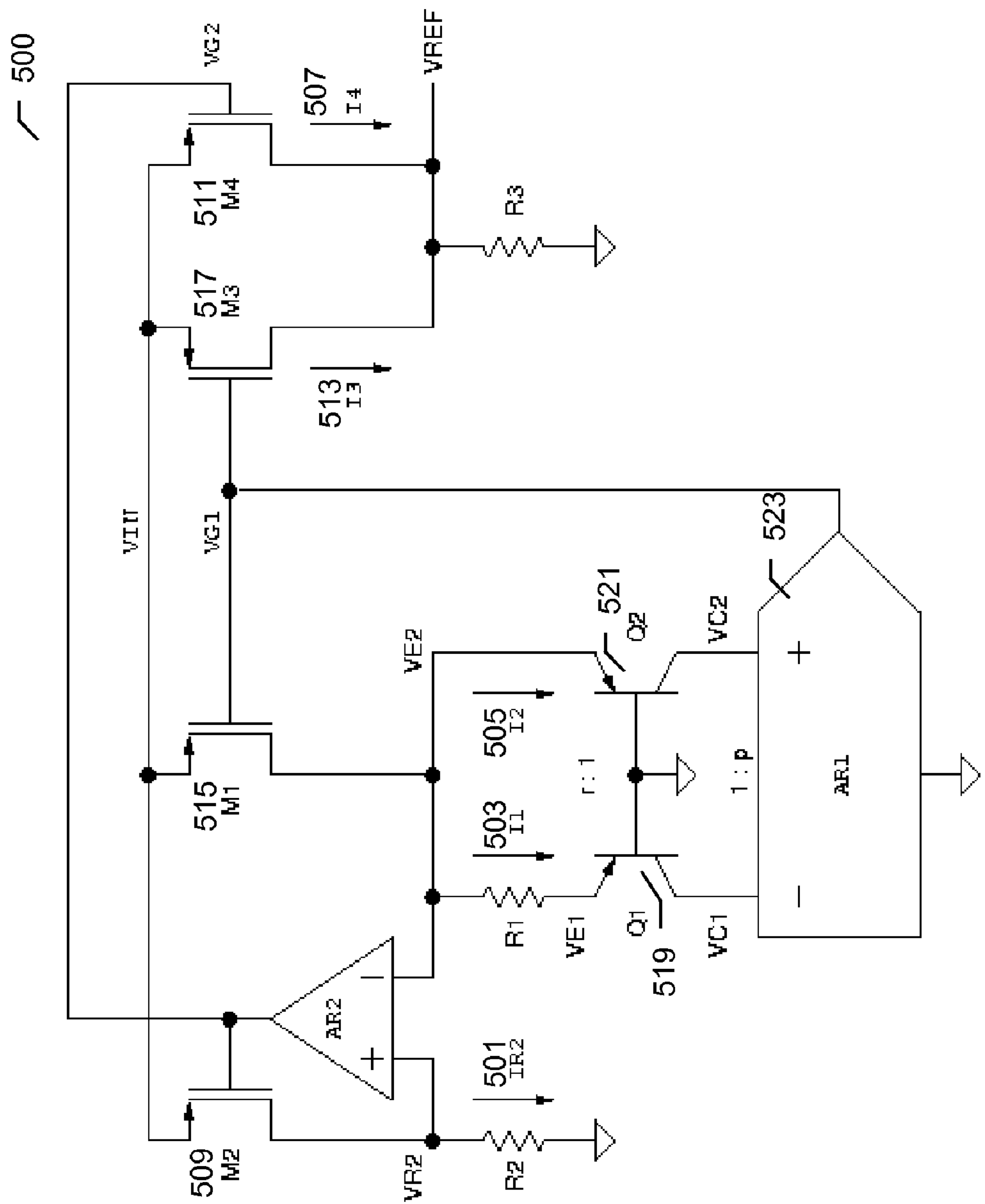
FIG. 5 is a schematic drawing of a second prior art voltage reference circuit.

The prior art circuit 500 shown in FIG. 5 presents one means of addressing the difficulties associated with post-fabrication calibration by separating current IR2 501 from current I1 503 and current I2 505. In this circuit, a CTAT current I4 507 is generated by a P-type current mirror composed of transistors M2 509 and M4 511 and a PTAT current I3 513 is generated by another P-type current mirror composed of transistors M1 515 and M3 517. The ratio of I4 507 to IR2 501 is controlled by the relative sizes of transistors M2 509 and M4 511. Likewise, the ratio of I3 to (I1+I2=(1+p) I1) is controlled by the relative sizes of transistors M1 515 and M3 517. If either or both of these current mirrors is constructed from an array of much smaller transistor segments, it is possible to control the current transfer ratio of one or both of these current mirrors by digital means after chip fabrication.

Figure 6:
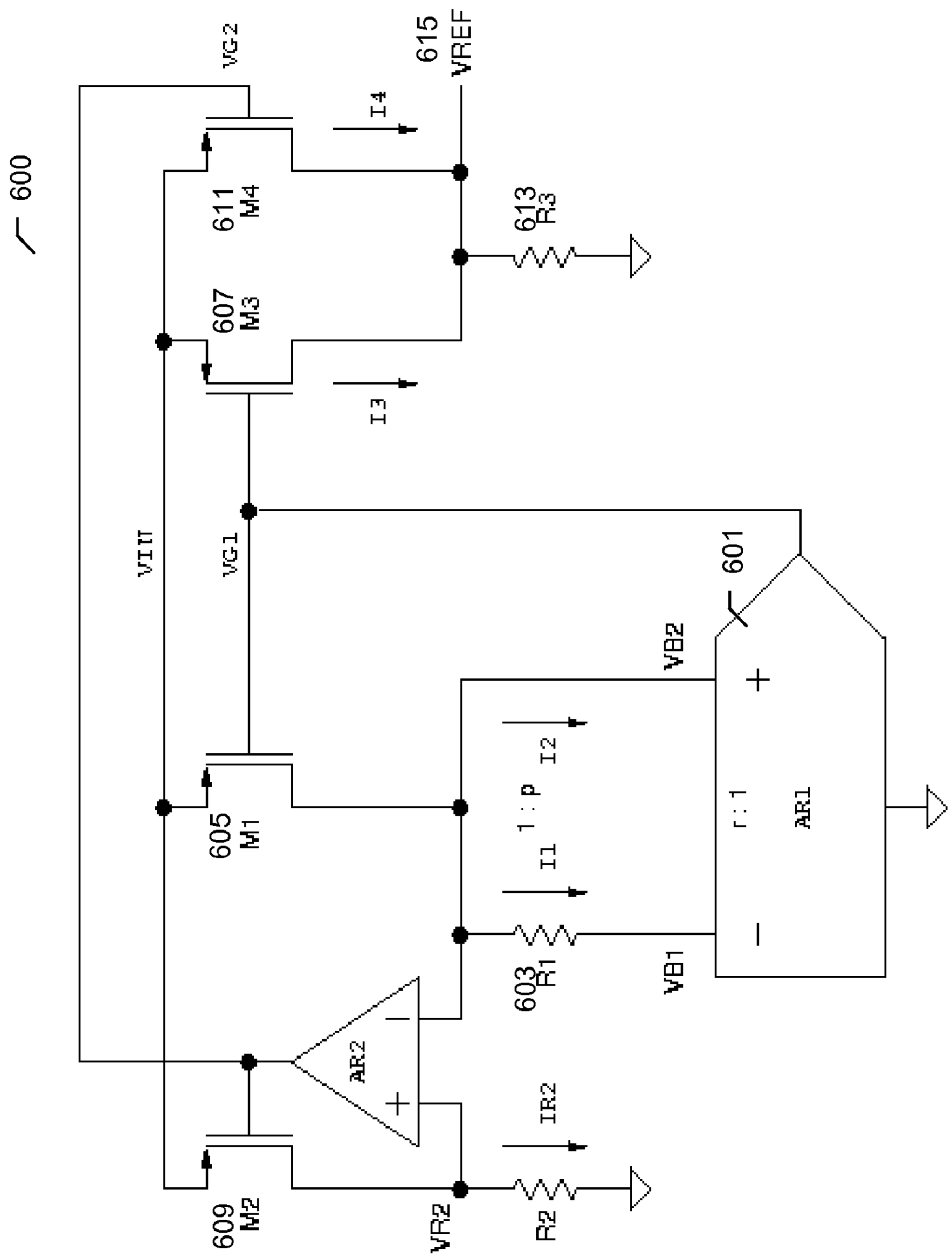
FIG. 6 is a schematic drawing of a second voltage reference circuit in accordance with an aspect of the invention.

In FIG. 6, the reference circuit 500 has been modified in accordance with one aspect of the invention to achieve a voltage reference circuit 600. In circuit 500, the BJTs 519 and 521 were constructed external to a current difference amplifier 523. In circuit 600, transistors similar to BJTs 519 and 521 have been integrated into a current differencing amplifier 601. The current differencing amplifier 601 may be constructed in accordance with any of a number designs. For example, the design shown in FIG. 4 may be used as the current differencing amplifier 601. As shown in FIG. 6, a first terminal of resistor R1 603 is electrically connected to a first input terminal of the current differencing amplifier 601, and a second terminal of resistor R1 603 is electrically connected to a second input terminal of the current differencing amplifier 603. The second terminal of the resistor R1 603 is also electrically connected to the drain of transistor M1 605.

Similar to FIG. 5, FIG. 6 depicts two current mirrors, one formed by transistors M1 605 and M3 607 and the other formed by transistors M2 609 and M4 611, which can be used to control the ratios of currents within circuit 600 in the same manner transistors 509, 511, 515, and 517 control currents within circuit 500. As shown in FIG. 6, currents I3 and I4 flow through a resistor R3 613, wherein one terminal of resistor R3 613 is electrically connected to ground. The output voltage Vref 615 can be measured at the node comprising the drain connections of transistors 607 and 611 and the ungrounded terminal of resistor 613.

Those of skill in the art will appreciate that the example circuits presented thus far require a start-up circuit. For clarity, such start-up circuits are not shown.

Figure 7:
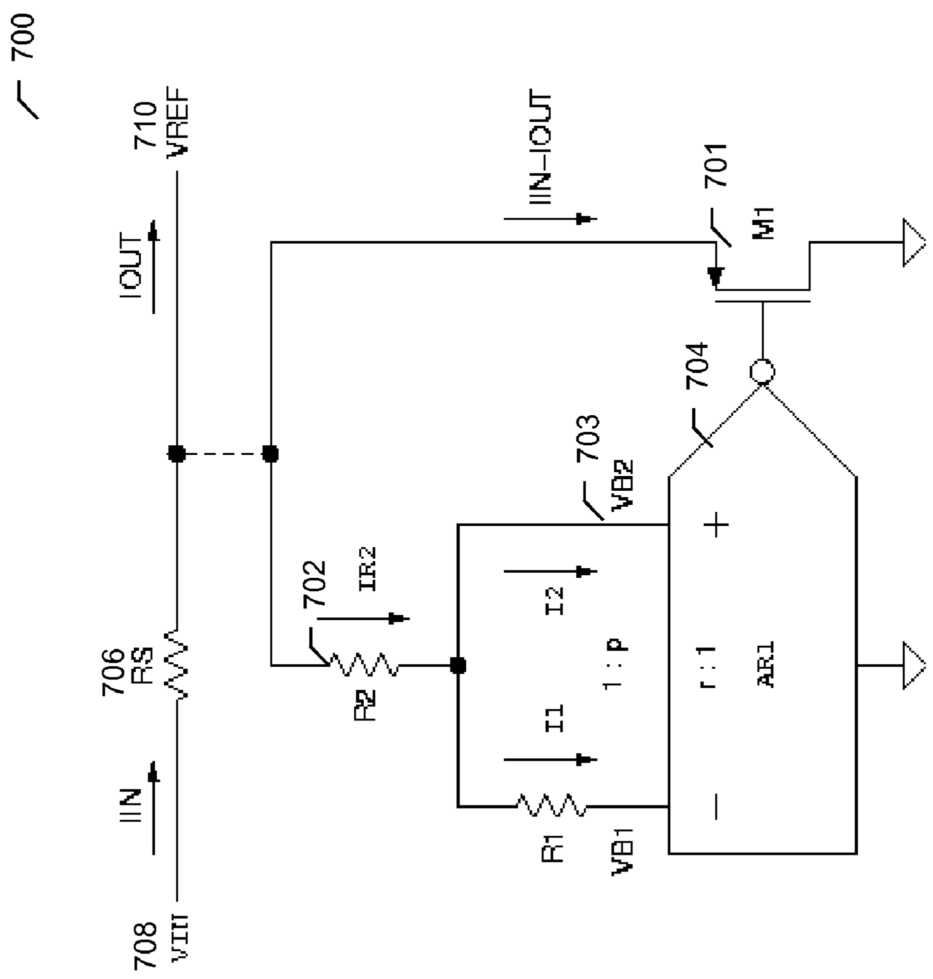
FIG. 7 is a schematic drawing of a third example voltage reference circuit in accordance with an aspect of the invention.

FIG. 7 depicts an example of a shunt type voltage reference circuit 700 in accordance with another aspect of the invention. The circuit 700 may be used to provide a reference voltage in a wide variety of circuits where a sub-bandgap output voltage is not required. In FIG. 7, a PMOS transistor 701 is used as a shunt element, and a resistor 702 is placed in series with the VB2 input 703 of the current differencing amplifier 704.

Those skilled in the art will appreciate that the PMOS transistor 701 could be replaced with a NMOS transistor, a PNP bipolar transistor, a P-type DTMOS (Dynamic Threshold Metal Oxide Semiconductor) or LDMOS (Laterally Diffused Metal Oxide Semiconductor) transistor, or another circuit element. In the configuration shown in FIG. 7, a PTAT current flows through the resistor 702, allowing the circuit to achieve a constant reference voltage rather than a constant current that is translated to a voltage. While FIG. 7 shows the current differencing amplifier 704 as an inverting amplifier, those skilled in the art will appreciate that the circuit 700 could be configured such that a non-inverting current differencing amplifier could also be used. The source resistance, RS 706, is required in any practical application but is not a part of the shunt regulator circuit 700. Unlike other examples described above where additional circuitry, such as start-up circuitry, was omitted for clarity, the shunt regulator of FIG. 7 is complete. Circuit 700 does not require the start-up circuits that the other circuits require because it is automatically self-starting when power for the current differencing amplifier is derived from either VIN 708 or VREF 710.

Figure 8:
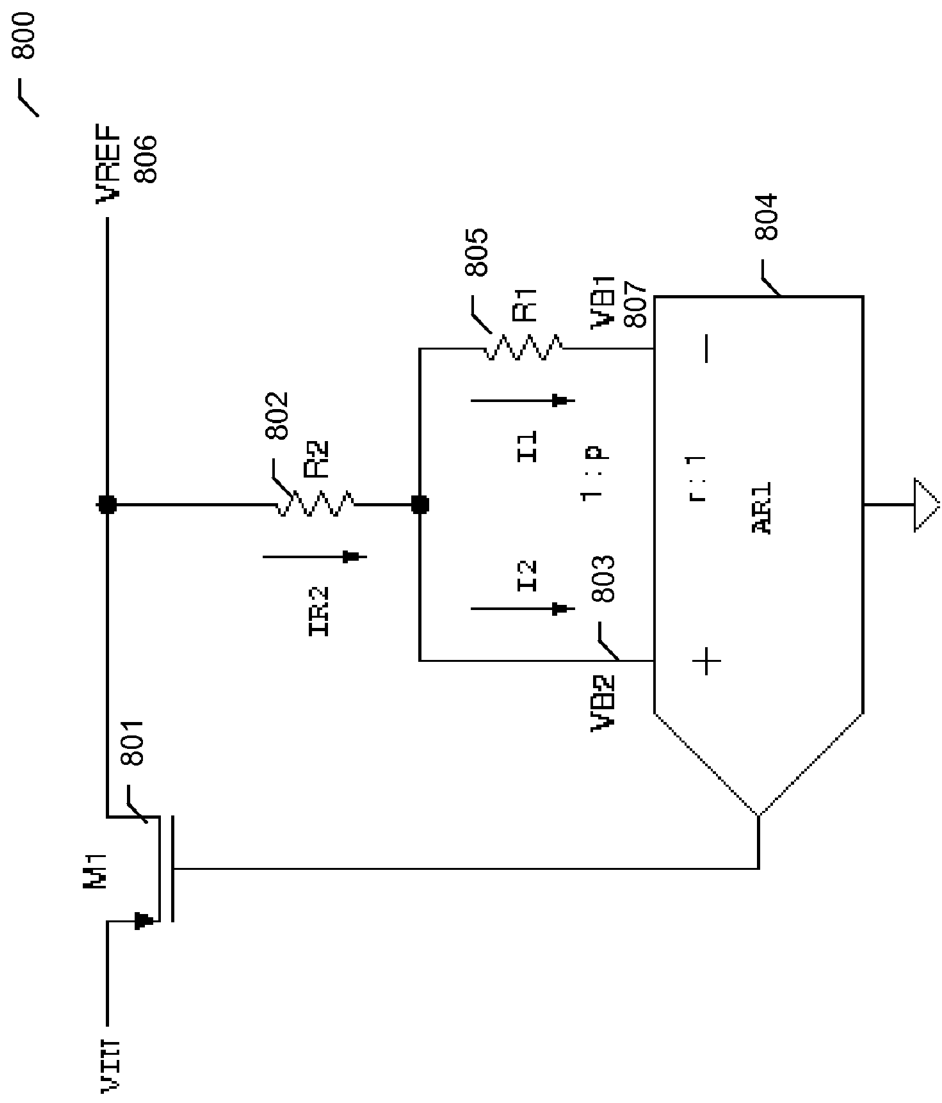
FIG. 8 is a schematic drawing of a fourth example voltage reference circuit in accordance with an aspect of the invention.

Circuit 800 shown in FIG. 8 depicts another aspect of the invention in which a series regulator rather than a shunt regulator is formed. In FIG. 8, a PMOS transistor 801 is used as a pass element. While FIG. 8 depicts a PMOS transistor as the pass element, those skilled in the art will appreciate that many different transistor types may be used as a pass element in circuit 800, including, for example, PNP bipolar transistors, P-type DTMOS transistors, or P-type LDMOS transistors. Further, circuit 800 could be configured to use N-type or NPN-type transistors as pass elements. As with circuit 700, a resistor 802 is placed in series with the VB2 input 803 of the current differencing amplifier 804. When in use, a PTAT current flows through another resistor 805, allowing the circuit 800 to achieve a constant reference voltage measured at VREF 806. As shown in FIG. 8, one terminal of the resistor 805 is electrically connected to the VB1 input 807 of the current differencing amplifier 804. For simplicity, the start-up circuit for this voltage regulator is not shown in FIG. 8.

Figure 9:
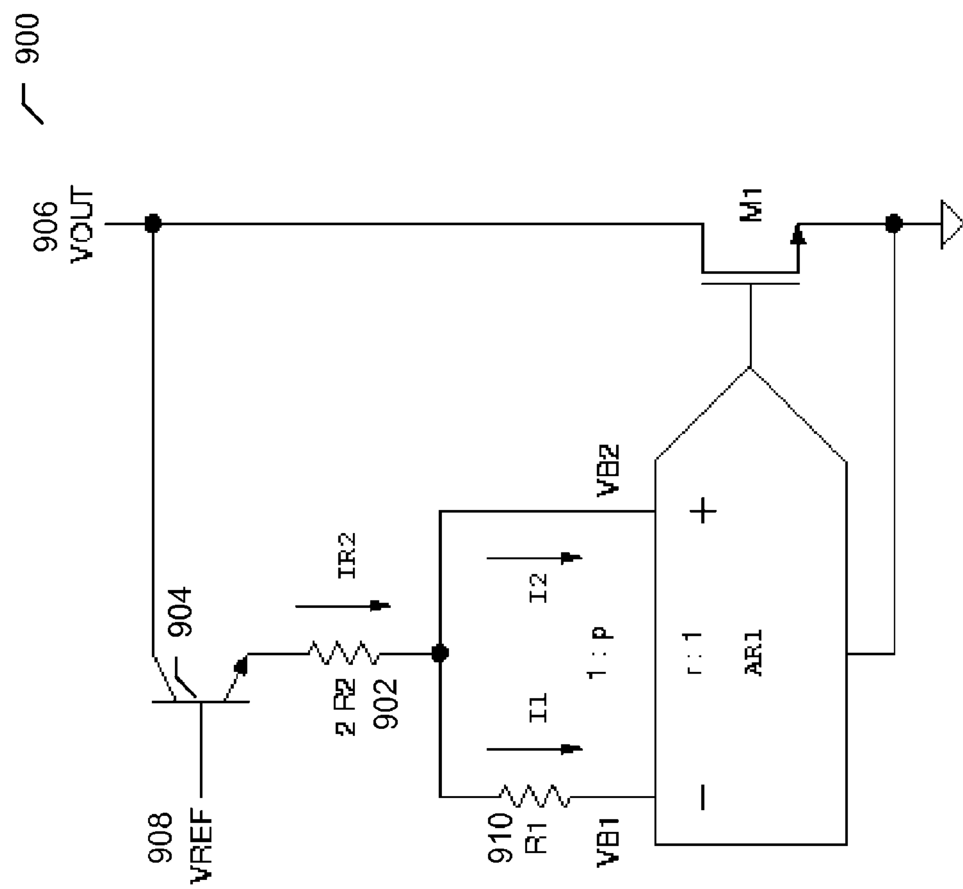
FIG. 9 is a schematic drawing of a fifth example voltage reference circuit in accordance with an aspect of the invention.

FIG. 9 depicts another aspect of the invention in which circuit 900 may be used to perform a shunt regulation function similar to that shown in FIG. 7. In this circuit, the value of R2 902 is doubled compared to the value of resistor 702 in FIG. 7, and an NPN transistor 904 between one terminal of the resistor R2 902 and the Vout connection 906. In the configuration shown in FIG. 9, the NPN transistor 904 acts to double the voltage at which the circuit regulates to two bandgap voltages (2 Vbg=Vbe+2 R2+Vbe), or about 2.5 volts for silicon. Those skilled in the art will appreciate that the first Vbe in this equation is the base-emitter voltage of the transistor 904 and the second Vbe is the base-emitter voltage of the transistor inside AR1 connected to the positive input terminal. In FIG. 9, if the VREF input 908 of the circuit 900 is shorted to the VOUT output 906, then this shunt regulator may be used with an external power supply, VIN, and a series resistor RS, as shown in FIG. 7, to form a 2.5 V voltage reference. The circuit of FIG. 9 may also be used with a two-resistor voltage divider network to provide other values of reference voltage when the midpoint of the two resistors in the voltage divider network are connected to the VREF input 908 and the two ends of the voltage divider are connected to VOUT 906 and ground. The regulated output voltage of this circuit may be calculated from the formula below where a resistor R1 is the value of the resistor in a voltage divider network that is connected to ground, R2 is the value of the resistor in a voltage divider network connected to VOUT, and VREF=2 Vbg.

$$VOUT=VREF*(1+R2/R1)$$

This can also be done with the shunt regulator of FIG. 7 but it is more practical to do this with the circuit of FIG. 9 because the VREF 908 input current required by this circuit 900 (at the base of transistor 908) is much less than the input current, (1+p) I1 required by the circuit of FIG. 7. As before with circuit 700, this circuit does not require a start-up circuit because it is automatically self-starting when power for the current differencing amplifier is derived from either VIN or VOUT.

All of the transistors in the above embodiments may be fabricated in a variety of ways. Different types of FETs (such as NMOS or PMOS), DTMOS transistors (such as NDTMOS or PDTMOS) or BJTs (such as NPN or PNP) may be implemented to construct alternative embodiments. Those skilled in the art will understand, however, that additional changes and modifications may be made to these embodiments without departing from the true scope and spirit of the present invention, which is defined by the claims.

What is claimed is:

1. A low voltage reference circuit comprising:

a current-differencing amplifier having a first input terminal, a second input terminal, and an output terminal, wherein the first input terminal comprises a first Bipolar Junction Transistor, wherein the current-differencing amplifier includes the first Bipolar Junction Transistor, wherein the second input terminal comprises a second Bipolar Junction Transistor, wherein the current-differencing amplifier includes the second Bipolar Junction Transistor, and wherein a difference in operating currents at the first input terminal and the second input terminal results in a corresponding output voltage at the output terminal.

2. The low-voltage reference circuit of claim 1 further comprising a first Field Effect Transistor (FET) and a second FET, wherein a gate of the first FET is electrically connected to a gate of the second FET, a source of the first FET is electrically connected to a source of the second FET, and wherein the output terminal of the current-differencing amplifier is electrically connected to the gates of the first FET and the second FET.

3. The low-voltage reference circuit of claim 2 further comprising a first resistor, wherein a first terminal of the first resistor is electrically connected to the first input terminal of the current-differencing amplifier.

4. The low-voltage reference circuit of claim 3, wherein a second terminal of the first resistor is electrically connected to the second input terminal of the current differencing amplifier.

5. The low-voltage reference circuit of claim 4 wherein the second terminal of the first resistor is electrically connected to a drain of the first FET and electrically connected to a second resistor.

6. The low-voltage reference circuit of claim 5 further comprising a third resistor, wherein a first terminal of the third resistor is electrically connected to a drain of the second FET and a second terminal of the third resistor is electrically connected to ground.

7. The low-voltage reference circuit of claim 1 wherein the current-differencing amplifier comprises a first current mirror and a second current mirror, wherein the first current mirror comprises the first Bipolar Junction Transistor and wherein the second current mirror comprises the second Bipolar Junction Transistor.

8. The low-voltage reference circuit of claim 7 wherein the current-differencing amplifier comprises a third current mirror electrically coupled to the first current mirror and the second current mirror.

9. A low-voltage reference circuit comprising:

a current-differencing amplifier having a first input terminal, a second input terminal, and an output terminal, wherein the first input terminal comprises a first Bipolar Junction Transistor, wherein the current-differencing amplifier includes the first Bipolar Junction Transistor, wherein the second input terminal comprises a second Bipolar Junction Transistor, wherein the current-differencing amplifier includes the second Bipolar Junction Transistor, and wherein a difference in operating currents at the first input terminal and the second input terminal results in a corresponding output voltage at the output terminal; and wherein the output terminal of the current-differencing amplifier is electrically connected to a transistor.

10. The low-voltage reference circuit of claim 9 further comprising a first resistor and a second resistor, wherein a first terminal of the first resistor is electrically connected to the first input terminal of the current-differencing amplifier and a second terminal of the first resistor is electrically connected to the second input terminal of the current differencing amplifier and a first terminal of the second resistor.

11. The low-voltage reference circuit of claim 10 wherein a second terminal of the second resistor is electrically coupled to the transistor.

12. The low-voltage reference circuit of claim 11 wherein the transistor is a Field Effect Transistor (FET) and the output terminal of the current differencing amplifier is electrically connected to the gate of the FET.

13. The low-voltage reference circuit of claim 11 wherein the transistor is further configured as a series regulator.

14. The low-voltage reference circuit of claim 13 wherein the transistor is a bipolar junction transistor, a field effect transistor, a dynamic threshold metal oxide semiconductor transistor, or a laterally diffused metal oxide semiconductor.

15. The low-voltage reference circuit of claim 11 wherein the second terminal of the second resistor is electrically connected to a series element.

16. The low-voltage reference circuit of claim 15 wherein the series element is a third resistor, and wherein a first terminal of the third resistor is configured as a input of the low-voltage reference circuit and a second terminal of the third resistor is configured as an output of the low-voltage reference circuit.

17. A low-voltage reference circuit comprising:

a first field effect transistor (FET) a second FET, a third FET and a fourth FET, having interconnected sources and wherein:

a gate of the first FET is electrically connected to a gate of the third FET;

a gate of the second FET is electrically connected to a gate of the fourth FET;

a drain of the first FET is electrically connected to a first terminal of a first resistor and to a first input terminal of a current-differencing amplifier without connecting through a first Bipolar Junction Transistor that is external to the current-differencing amplifier;

a second terminal of the first resistor is electrically connected to a second input terminal of the current-differencing amplifier without connecting through a second Bipolar Junction Transistor that is external to the current-differencing amplifier; and an output of the current-differencing amplifier is electrically connected to the gate of the first FET and the gate of the third FET.

18. The low-voltage reference circuit of claim 17 wherein the first input terminal of the current-differencing amplifier comprises a third bipolar junction transistor that is included within the current-differencing amplifier and the second input terminal of the current-differencing amplifier comprises a fourth bipolar junction transistor that is included within the current-differencing amplifier.

19. The low-voltage reference circuit of claim 18 wherein the third FET and the fourth FET are configured with interconnected drains, and wherein the interconnected drains are electrically connected to a terminal of a second resistor.

20. The low-voltage reference circuit of claim 19 wherein the first bipolar junction transistor is electrically connected to a third bipolar junction transistor to form a first current mirror and the second bipolar junction transistor is electrically connected to a fourth bipolar junction transistor to form a second current mirror.

* * * * *